(12) United States Patent
Hedayati et al.

(10) Patent No.: US 9,800,280 B2
(45) Date of Patent: Oct. 24, 2017

(54) NOISE SUPPRESSION IN RADIO FREQUENCY RECEIVERS

(71) Applicant: QUALCOMM Incorporated, San Diego, CA (US)

(72) Inventors: Hajir Hedayati, San Diego, CA (US); Milad Darvishi, San Diego, CA (US); Jeremy Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/176,109

(22) Filed: Jun. 7, 2016

(65) Prior Publication Data

US 2017/0201280 A1  Jul. 13, 2017

Related U.S. Application Data

(60) Provisional application No. 62/277,891, filed on Jan. 12, 2016.

(51) Int. Cl.
| | |
|---|---|
| *H04B 1/18* | (2006.01) |
| *H04B 1/16* | (2006.01) |
| *H03F 3/19* | (2006.01) |
| *H03F 1/08* | (2006.01) |
| *H03F 3/68* | (2006.01) |
| *H04L 27/38* | (2006.01) |

(52) U.S. Cl.
CPC ............... *H04B 1/16* (2013.01); *H03F 1/08* (2013.01); *H03F 3/19* (2013.01); *H03F 3/68* (2013.01); *H04L 27/38* (2013.01); *H03F 2200/294* (2013.01); *H03F 2200/451* (2013.01)

(58) Field of Classification Search
CPC .......... H03F 1/0277; H03F 3/211; H03F 1/06; H03F 3/68; H04F 3/19; H04F 1/08; H04F 3/68; H04F 2200/294; H04F 2200/451; H04B 1/0458; H04B 7/15535; H04B 1/16; H03H 2/008; H04L 27/38
USPC ..... 455/114.3, 127.3, 194.2, 189.1, 209, 293
See application file for complete search history.

(56) References Cited

U.S. PATENT DOCUMENTS

| | | | |
|---|---|---|---|
| 7,392,033 B2 | 6/2008 | Darabi | |
| 7,888,996 B1 * | 2/2011 | Barnett | ..................... H03F 3/38 327/124 |
| 8,907,702 B1 * | 12/2014 | Solomko | .............. H03D 13/008 327/3 |
| 8,929,847 B2 | 1/2015 | Chung et al. | |
| 9,065,703 B2 | 6/2015 | Jung et al. | |

(Continued)

FOREIGN PATENT DOCUMENTS

| | | |
|---|---|---|
| EP | 2624462 A1 | 8/2013 |
| JP | 2008103970 A | 5/2008 |

OTHER PUBLICATIONS

International Search Report and Written Opinion—PCT/US2016/066208—ISA/EPO—dated Mar. 28, 2017.

*Primary Examiner* — Dominic Rego
(74) *Attorney, Agent, or Firm* — Qualcomm Incorporated/Seyfarth Shaw LLP

(57) ABSTRACT

A radio frequency (RF) receiver device may include a receive path including a first amplifier. The device also includes a first mixer coupled to an output of the first amplifier and to an input of a second amplifier. Further, the device may include an auxiliary path including a second mixer coupled between an output of the first mixer and an input of the first mixer.

21 Claims, 13 Drawing Sheets

(56) References Cited

U.S. PATENT DOCUMENTS

| | | | |
|---|---|---|---|
| 9,148,186 B1 | 9/2015 | Wu et al. | |
| 2006/0181357 A1* | 8/2006 | Chae | H03K 3/0322 331/57 |
| 2007/0238435 A1* | 10/2007 | Kim | H04B 1/1036 455/313 |
| 2009/0179704 A1* | 7/2009 | Staudinger | H03F 1/56 330/295 |
| 2010/0267354 A1* | 10/2010 | Mirzaei | H03D 7/1458 455/307 |
| 2012/0026039 A1* | 2/2012 | Ganeshan | G01S 19/33 342/357.73 |
| 2013/0195215 A1* | 8/2013 | Manglani | H04B 17/318 375/295 |
| 2013/0303103 A1* | 11/2013 | Mikhemar | H04B 1/123 455/303 |
| 2014/0018026 A1* | 1/2014 | Klepser | H04B 1/005 455/230 |
| 2014/0159933 A1* | 6/2014 | Dufrene | H03M 1/0612 341/144 |
| 2014/0355728 A1* | 12/2014 | Liao | H04B 1/10 375/346 |
| 2015/0063509 A1 | 3/2015 | Hedayati et al. | |
| 2015/0180521 A1 | 6/2015 | Tripurari et al. | |
| 2016/0043768 A1* | 2/2016 | Uppathil | H04B 1/0082 455/78 |

* cited by examiner

US 9,800,280 B2

NOISE SUPPRESSION IN RADIO FREQUENCY RECEIVERS

CROSS REFERENCE TO RELATED APPLICATION

This application claims the benefit under 35 U.S.C. §119 (e) to U.S. Provisional Application No. 62/277,891, filed on Jan. 12, 2016, and titled "NOISE SUPPRESSION IN RADIO-FREQUENCY RECEIVERS," the disclosure of which is expressly incorporated by reference herein in its entirety.

BACKGROUND

Field

The present disclosure relates generally to wireless communication. More specifically, the present disclosure is related to radio frequency (RF) receivers.

Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3GPP long term evolution (LTE) systems, 3GPP2 ultra mobile broadband (UMB) systems, and orthogonal frequency division multiple access (OFDMA) systems.

In a communication system, a transmitter may process (e.g., encode and modulate) data. The transmitter may further condition (e.g., convert to analog, filter, frequency up-convert, and amplify) the data to generate an output radio frequency (RF) signal. The transmitter may then transmit the output RF signal via a communication channel to a receiver. The receiver may receive the transmitted RF signal and perform the complementary processing on the received RF signal. The receiver may condition (e.g., amplify, frequency down-convert, filter, and digitize) the received RF signal to obtain input samples. The receiver may further process (e.g., demodulate and decode) the input samples to recover the transmitted data.

SUMMARY

In an aspect of the present disclosure a device is presented. The device includes a receive path including a first amplifier, as well as a first mixer coupled to an output of the first amplifier and to an input of a second amplifier. The device also has an auxiliary path including a second mixer coupled between an output of the first mixer and an input of the first mixer.

In another aspect of the present disclosure, a method is presented. The method includes receiving a signal at an input of a first mixer and coupling a first output of the first mixer to a first input of a second amplifier according to a first duty cycle. The method also includes coupling a second output of the first mixer to a second input of the second amplifier according to a second, different duty cycle and coupling the second input of the second amplifier to a first amplifier and an input of the first mixer via a second mixer according to the first duty cycle. The method further includes coupling the first input of the second amplifier to the first amplifier and the input of the first mixer via the second mixer according to the second, different duty cycle.

An additional aspect of the present disclosure is directed to a device comprising means for receiving a signal at an input of a first mixer, and means for coupling a first output of the first mixer to a first input of according to a first duty cycle. The apparatus also has means for coupling a second output of the first mixer to a second input of the second amplifier according to a second, different duty cycle. The apparatus further includes means for coupling the second input of the second amplifier to a first amplifier and an input of the first mixer via a second mixer according to the first duty cycle. The apparatus also has means for coupling the first input of the second amplifier to the first amplifier and the input of the first mixer via the second mixer according to the second, different duty cycle.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below in connection with the appended drawings is intended as a description of exemplary aspects and is not intended to represent the only aspects that can be practiced. The term "exemplary" used throughout this description means "serving as an example, instance, or illustration," and should not necessarily be construed as preferred or advantageous over other exemplary aspects. The term "coupled" used throughout this description means "connected, whether directly or indirectly through intervening connections, electrical, mechanical, or otherwise," and is not necessarily limited to physical connections. Additionally, the connection can be such that the objects are permanently connected or releasably connected. The detailed description includes specific details for the purpose of providing a thorough understanding of the exemplary aspects. It will be apparent to those skilled in the art that the exemplary aspects may be practiced without these specific details. In some instances, well-known structures and devices are shown in block diagram form in order to avoid obscuring the novelty of the exemplary aspects presented herein.

Figure 1:
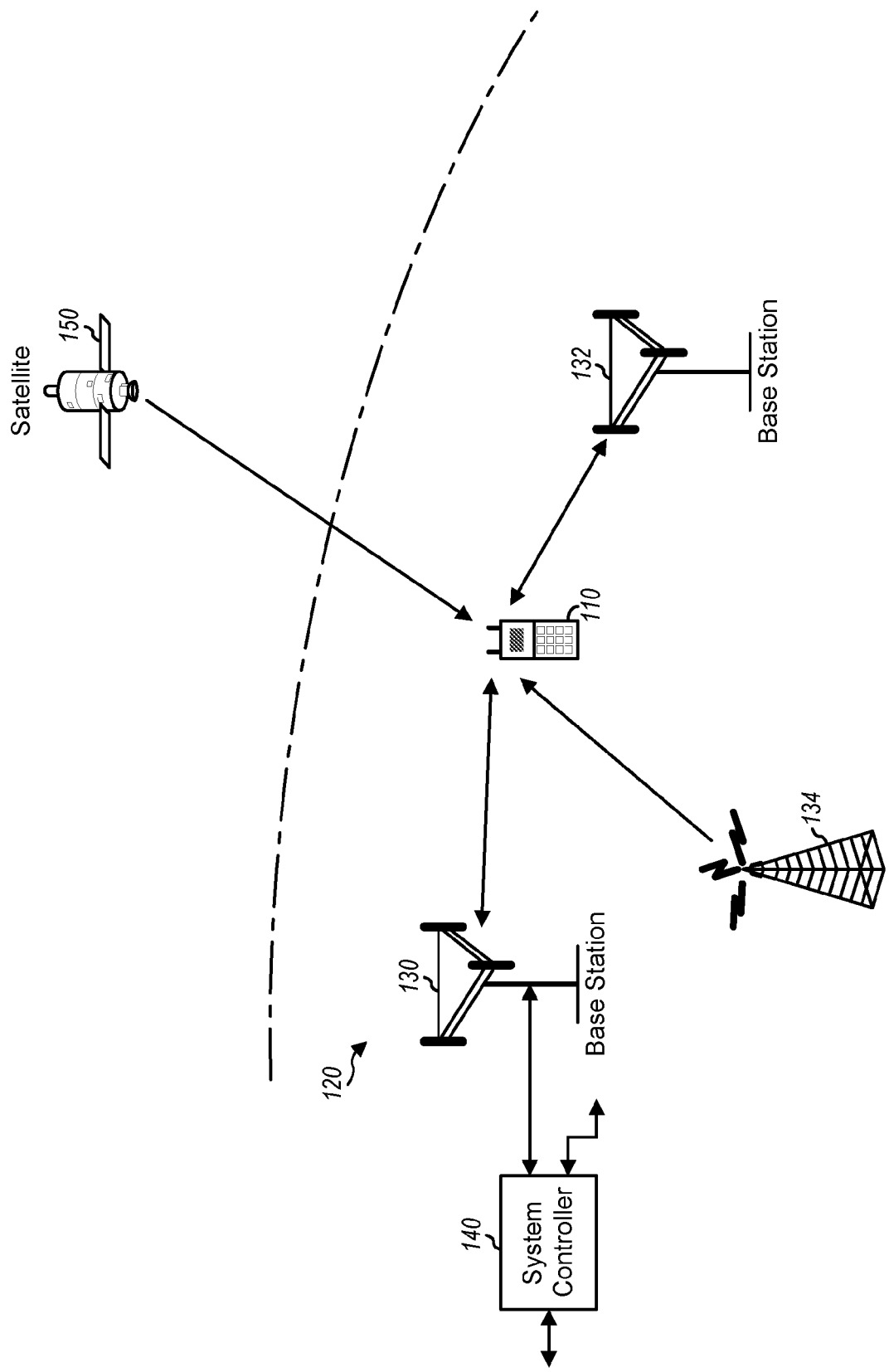
FIG. 1 shows a wireless device communicating with a wireless system, according to aspects of the present disclosure.

FIG. 1 shows a wireless device 110 communicating with a wireless communication system 120. Wireless system 120 may be a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), CDMA 1X, evolution-data optimized (EVDO), time division synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Such ranges are given as examples only, and such ranges do not limit the scope of the disclosure or claims. Low-band, mid-band, and high-band refer to three groups of bands (or band groups), with each band group including a number of frequency bands (or simply, "bands"). For example, in some systems each band may cover up to 200 MHz and may include one or more carriers. For example, each carrier may cover up to 20 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2:
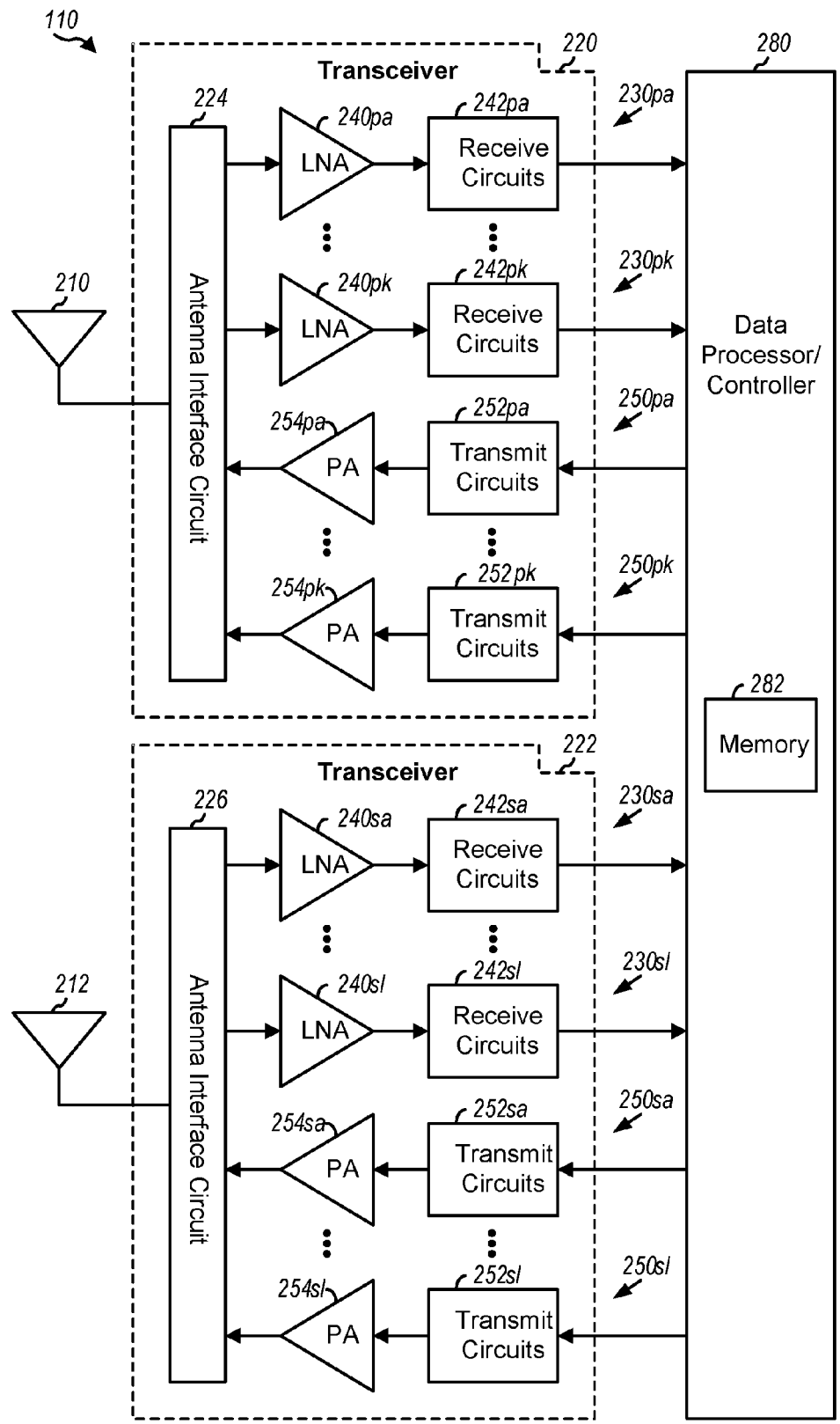
FIG. 2 shows a block diagram of the wireless device in FIG. 1, according to aspects of the present disclosure.

FIG. 2 shows a block diagram of an exemplary design of wireless device 110 in FIG. 1. In this exemplary design, wireless device 110 includes a transceiver 220 coupled to primary antenna 210, transceiver 222 coupled to secondary antenna 212, and data processor/controller 280. Transceiver 220 includes multiple (K) receivers $230pa$ to $230pk$ and multiple (K) transmitters $250pa$ to $250pk$ to support multiple frequency bands, multiple radio technologies, carrier aggregation, etc. Transceiver 222 includes L receivers $230sa$ to $230sl$ and L transmitters $250sa$ to $250sl$ to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received radio frequency (RF) signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver $230pa$ is the selected receiver. Within receiver $230pa$, an LNA $240pa$ amplifies the input RF signal and provides an output RF signal. Receive circuits $242pa$ downconvert the output RF signal from RF to baseband, amplify and filter the downconverted signal, and provide an analog input signal to data processor 280. Receive circuits $242pa$ may include mixers, filters, amplifiers, matching circuits, an oscillator, a local oscillator (LO) generator, a phase locked loop (PLL), etc. Each remaining receiver 230 in transceivers 220 and 222 may operate in a similar manner as receiver $230pa$.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter $250pa$ is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in a similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), radio frequency ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support CA and may (i) receive multiple downlink signals transmitted by one or more cells on multiple downlink carriers at different frequencies and/or (ii) transmit multiple uplink signals to one or more cells on multiple uplink carriers. Transmitters and receivers to support CA may be implemented on a single IC. However, it may be difficult or not possible to meet isolation requirements between the transmitters and receivers in certain transmit (TX) and receive (RX) bands due to limited pin-to-pin isolation on the IC.

For example, in the inter-CA mode, the isolation requirement between some TX and RX bands (e.g., UMTS Bands 4 and 17) may be 100 decibels (dB), which may be difficult or not possible to achieve since pin-to-pin isolation is worse than the isolation requirement. On-chip transmit filtering may improve pin-to-pin RX/TX isolation but (i) may degrade transmitter performance and (ii) may not reduce other RX/TX coupling mechanisms on the same IC. Furthermore, spurious signals from multiple PLLs and LO generators operating simultaneously on the same IC may degrade transmitter performance. Sensitivity of a receiver may also be degraded due to poor spurious and isolation performance.

In an aspect of the present disclosure, expandable transmitters and receivers implemented on multiple ICs may be used to support CA and mitigate the problems described above. Transmitters and receivers on the multiple ICs may be selected for use such that interference between these transmitters and receivers may be mitigated. As an example, for inter-band CA, a transmitter and a receiver on one IC may be used for communication on one band, and another transmitter and another receiver on another IC may be used for communication on another band. This may mitigate spurious and isolation problems encountered in the single-chip design. The teachings and claims herein also pertain to single-chip solutions. Multiple IC solutions are discussed as one example only.

Baseband filters within conventional radio frequency (RF) receivers are consuming a large area. Further, transistor sizes for transimpedance amplifier (TIA) input stages are also very large (e.g., to minimize flicker noise contribution), which, as a result, limits the available bandwidth. Thus, in conventional TIA design, there is a tradeoff between large bandwidth and flicker noise.

Figure 3:
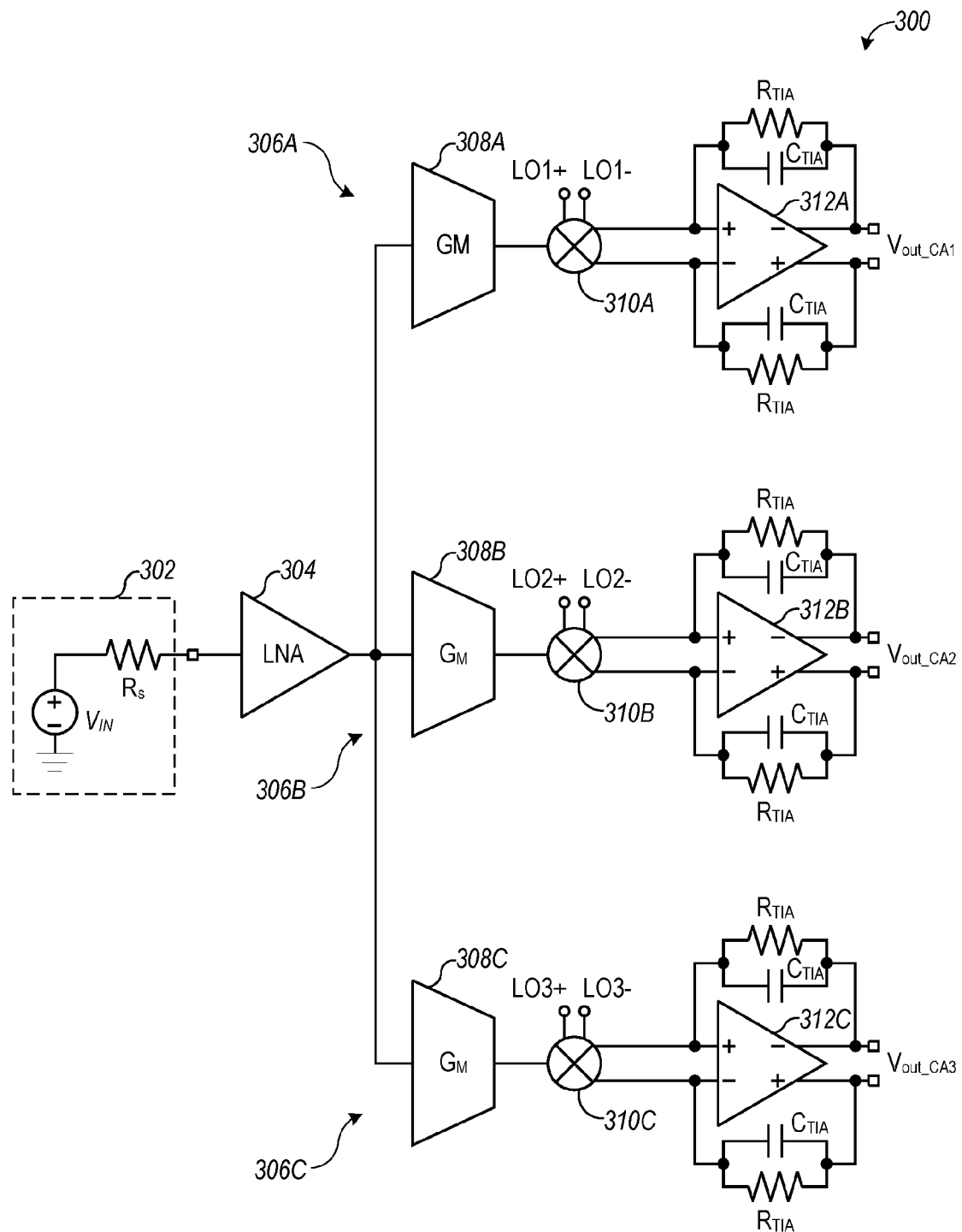
FIG. 3 illustrates a device including a plurality of baseband filters for carrier aggregation, according to aspects of the present disclosure.

FIG. 3 illustrates a device 300 including an antenna 302. In some aspects, antenna 302 may, for example, be represented by a voltage input $V_{IN}$ and a resistor $R_S$. Further, in some aspects, antenna 302 may be represented by the output of an amplifier stage or may be modeled as a source with characteristic impedance Zo having a real value $R_S$ for example. Device 300 further includes an LNA 304 coupled between antenna 302 and a plurality of paths 306A-306C. Each path 306 is configured to receive a signal from LNA 304 and output a voltage $V_{OUT\_CA}$. Each path 306 includes a transconductance amplifier 308, a mixer 310, an amplifier 312 (e.g., transimpedance amplifier or baseband operational amplifier (OPAMP)), resistors $R_{TIA}$ and capacitors $C_{TIA}$. As will be appreciated, conventional carrier aggregation devices that include a plurality of very large baseband filters (e.g., three as illustrated in FIG. 3) require a large amount of chip area for implementation. It is noted that device 300 may be operated without transconductance amplifier 308.

Figure 5:
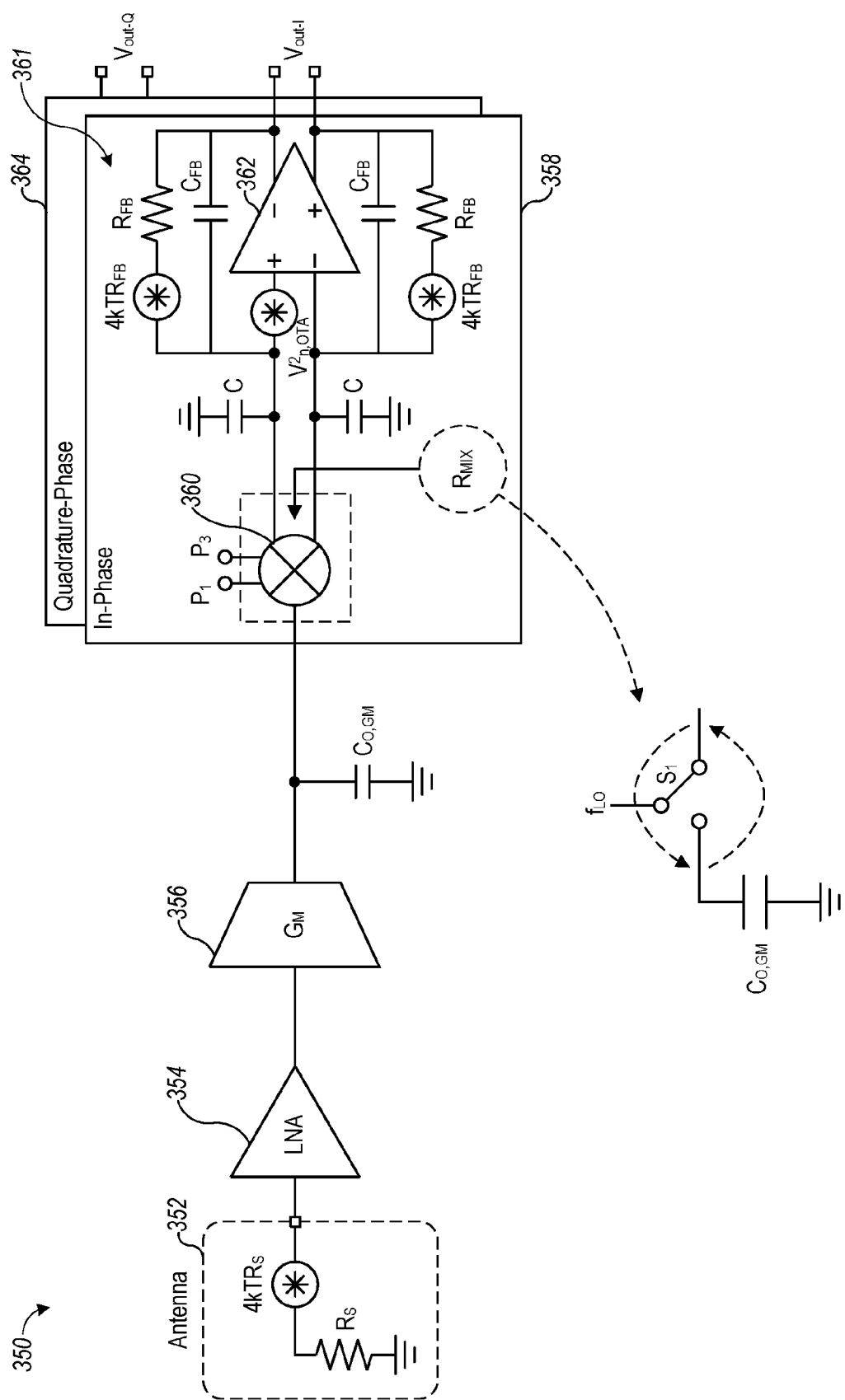
FIG. 5 illustrates a wireless receiver including a baseband filter and the loading from the mixer to the baseband filter, according to aspects of the present disclosure.

Aspects of the present disclosure, as described herein, relate to suppressing noise in a radio frequency (RF) receiver. According to one aspect, a device may include a receive path including a first mixer coupled to an input of an amplifier. Further, the device may include an auxiliary path including a second mixer coupled between an output of the first mixer and an input of the first mixer. In addition, the device may include an energy storage element (e.g., capacitor as modeled by $C_{O,GM}$ (for example, as shown in FIG. 5), or any other capacitor, or inductor by application of the duality principle) coupled between a ground and the input of the first mixer.

According to another aspect, the present disclosure includes methods for operating an RF receiver. Various aspects of such a method may include receiving a signal at an input of a first mixer. The method may also include coupling a first output of the first mixer to a first input of a second amplifier according to a first duty cycle, and coupling a second output of the first mixer to a second input of the second amplifier according to a second, different duty cycle. Further, the method may include coupling the second input of the second amplifier to a first amplifier (e.g., a transconductance amplifier), or a capacitor (e.g., a parasitic capacitor), inductor or other energy storage element and an input of the first mixer via a second mixer according to the first duty cycle, and coupling the first input of the second amplifier to the first amplifier or energy storage element and the input of the first mixer via the second mixer according to the second, different duty cycle.

Other aspects, as well as features and advantages of various aspects, of the present disclosure will become apparent to those of skill in the art though consideration of the ensuing description, the accompanying drawings and the appended claims.

Figure 4:
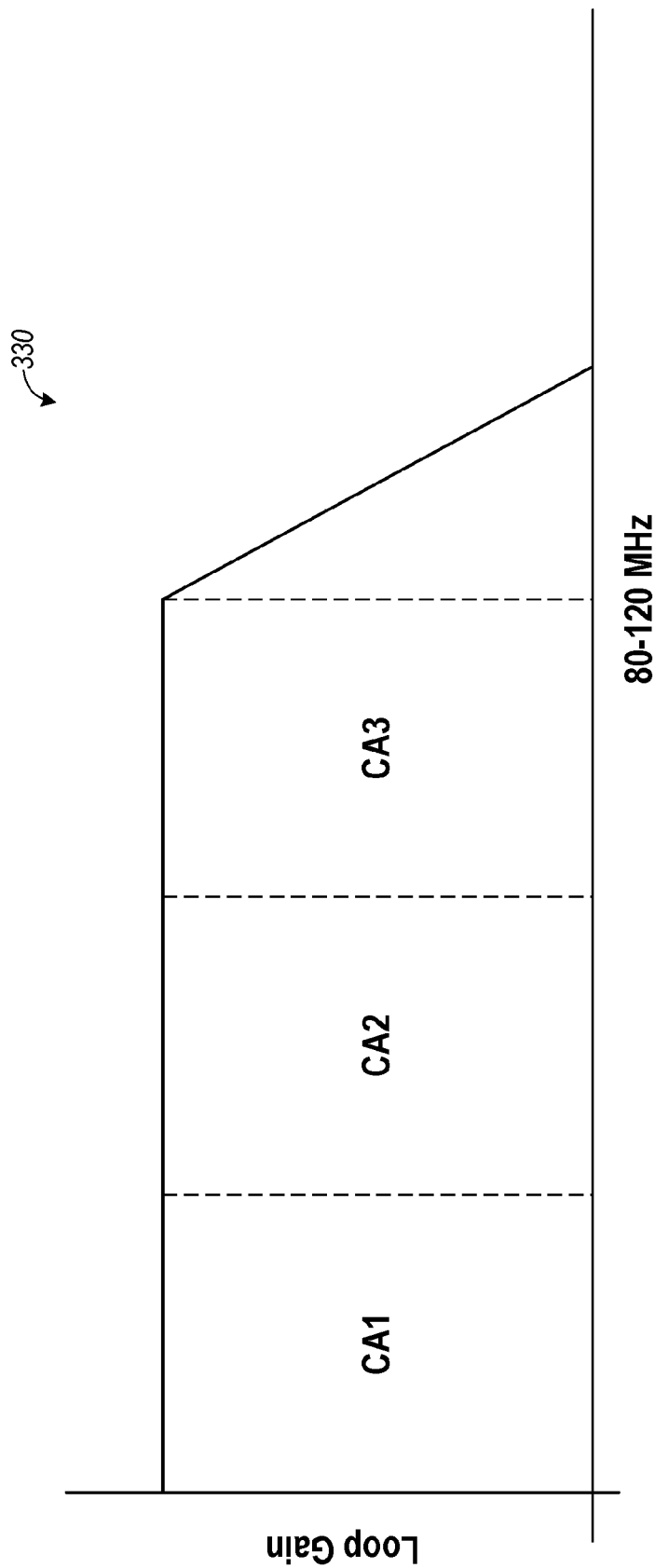
FIG. 4 is a plot depicting a loop gain across frequency for a wireless receiver baseband amplifier, according to aspects of the present disclosure.

FIG. 4 is a plot 330 depicting a loop gain of a baseband filter (e.g., baseband filter configured to support carrier aggregation) relative to frequency. As will be appreciated by a person having ordinary skill in the art, to implement a single baseband filter, as opposed to three baseband filters, in carrier aggregation, it may be important that a loop gain cover the combination of frequencies of all carrier components (e.g., CA1, CA2, and CA3), as depicted in plot 330. Achieving such a loop gain across such a large bandwidth may be very challenging and may require substantial effort and overall performance degradation.

FIG. 5 depicts a device 350, according to an aspect of the present disclosure. Device 350, which is configured to convey an output voltage $V_{OUT-I}$ and $V_{OUT-Q}$, includes an antenna 352, an LNA 354, a transconductance amplifier 356, and a capacitor $C_{O,GM}$. Capacitor $C_{O,GM}$ is depicted to model a sum of a parasitic capacitance of transconductance amplifier 356 and mixer 360 at the output of transconductance amplifier 356. As illustrated, a resistor $R_S$ and a component $4kTR_S$ model noise of antenna 352. Device 350 further includes an in-phase unit 358 including a mixer 360, capacitors C, and a baseband filter 361, which includes a transimpedance amplifier 362, feedback resistors $R_{FB}$, and feedback capacitors $C_{FB}$. As illustrated, $4kTR_{FB}$ models the noise of the feedback network of baseband filter 361, and $V^2_{n,OTA}$ models the flicker noise of baseband filter 361. FIG. 5 further illustrates "$R_{MIX}$" that models the loading on baseband filter 361 from mixer 360. It is noted that device 350 may further include a quadrature-phase unit 364, details of which are not illustrated in FIG. 5.

FIG. 5 further depicts a switch S1, which represents at least a portion of mixer 360, configured to receive a local oscillator signal $f_{LO}$ to couple baseband filter 361 to capacitor $C_{O,GM}$. The local oscillator signal $f_{LO}$ may, for example, have a duty cycle of 25% or 50%. Of course, the duty cycle is merely exemplary and not limiting, and other values can also be used (e.g., 26% or 51%) to allow for overlap in switching to prevent a transconductance impedance of transconductance amplifier 356 from going too high and to couple baseband filter 361 to capacitor $C_{O,GM}$. The duty cycle may control when the switch is opened or closed. Stated another way, when signal $f_{LO}$ is high ("on"), switch S1 may couple baseband filter 361 to the parasitic capacitance, as modeled by capacitor $C_{O,GM}$, and when signal $f_{LO}$ is low ("off"), switch S1 may isolate baseband filter 361 from the parasitic capacitance, as modeled by capacitor $C_{O,GM}$. The switching effect on the parasitic capacitance modeled by $C_{O,GM}$ results in "$R_{MIX}$," which models the loading on baseband filter 361 from mixer 360.

Figure 6:
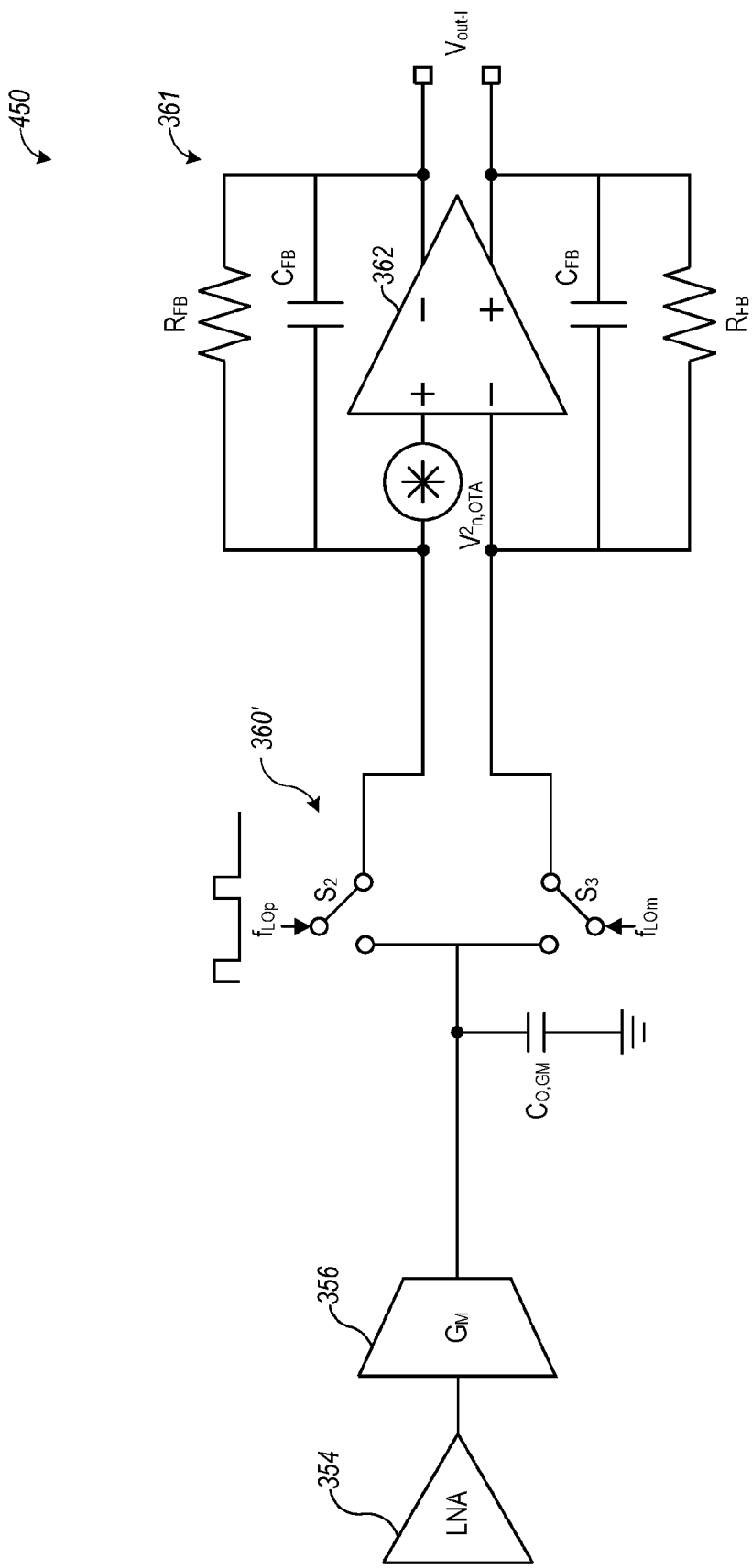
FIG. 6 illustrates a mixer coupled to a baseband filter of a wireless receiver, according to aspects of the present disclosure.

FIG. 6 illustrates another device 450, in accordance with aspects of the present disclosure. Device 450, which is configured to convey an output voltage $V_{OUT-I}$, includes LNA 354, and transconductance amplifier 356, and can have parasitic capacitance, as modeled by capacitor $C_{O,GM}$. In addition, device 450 includes mixer 360', which is represented via switches S2 and S3. Moreover, device 450 includes baseband filter 361 comprising transimpedance amplifier 362, feedback resistors $R_{FB}$, and feedback capacitors $C_{FB}$. As illustrated, $V^2_{n,OTA}$ is for modelling purposes only, and models the flicker noise of baseband filter 361.

During a contemplated operation, switch S2 is configured to receive local oscillator signal $f_{LOp}$ that comprises a frequency (e.g., a phase) and a duty cycle (e.g., 25% or 50%, non-limiting) to close switch S2 to couple one input (e.g., non-inverting input) of transimpedance amplifier 362 to the parasitic capacitance, as modeled by capacitor $C_{O,GM}$. During this phase of the cycle, switch S3 may be open. Further, during another phase of the cycle, switch S3 is configured to receive a local oscillator signal $f_{LOm}$ to close switch S3 to couple another input (e.g., inverting input) of transimpedance amplifier 362 to the parasitic capacitance, as modeled by capacitor $C_{O,GM}$. During this phase of the cycle, switch S2 may be open. Stated another way, during one phase when signal $f_{LOp}$ is high ("on") and signal $f_{LOm}$ is low ("off"), switch S3 is open, switch S2 is closed, and one input (e.g., non-inverting input) of transimpedance amplifier 362 may be coupled to the parasitic capacitance, as modeled by capacitor $C_{O,GM}$. In addition, during another phase when signal $f_{LOp}$ is low ("off") and signal $f_{LOm}$ is high ("on"), switch S2 is open, and switch S3 is closed, thus coupling another input (e.g., inverting input) of transimpedance amplifier 362 to the parasitic capacitance, as modeled by capacitor $C_{O,GM}$. As one non-limiting example, signal $f_{LOp}$ and signal $f_{LOm}$ may be phase-shifted by 180 degrees.

In this aspect, flicker noise, as will be understood by a person having ordinary skill in the art, may be charged to a parasitic capacitor (e.g., capacitor $C_{O,GM}$) in one phase, and discharged in another, different phase. Further, flicker current may be amplified through the feedback resistor of baseband filter 361.

Figure 7A:
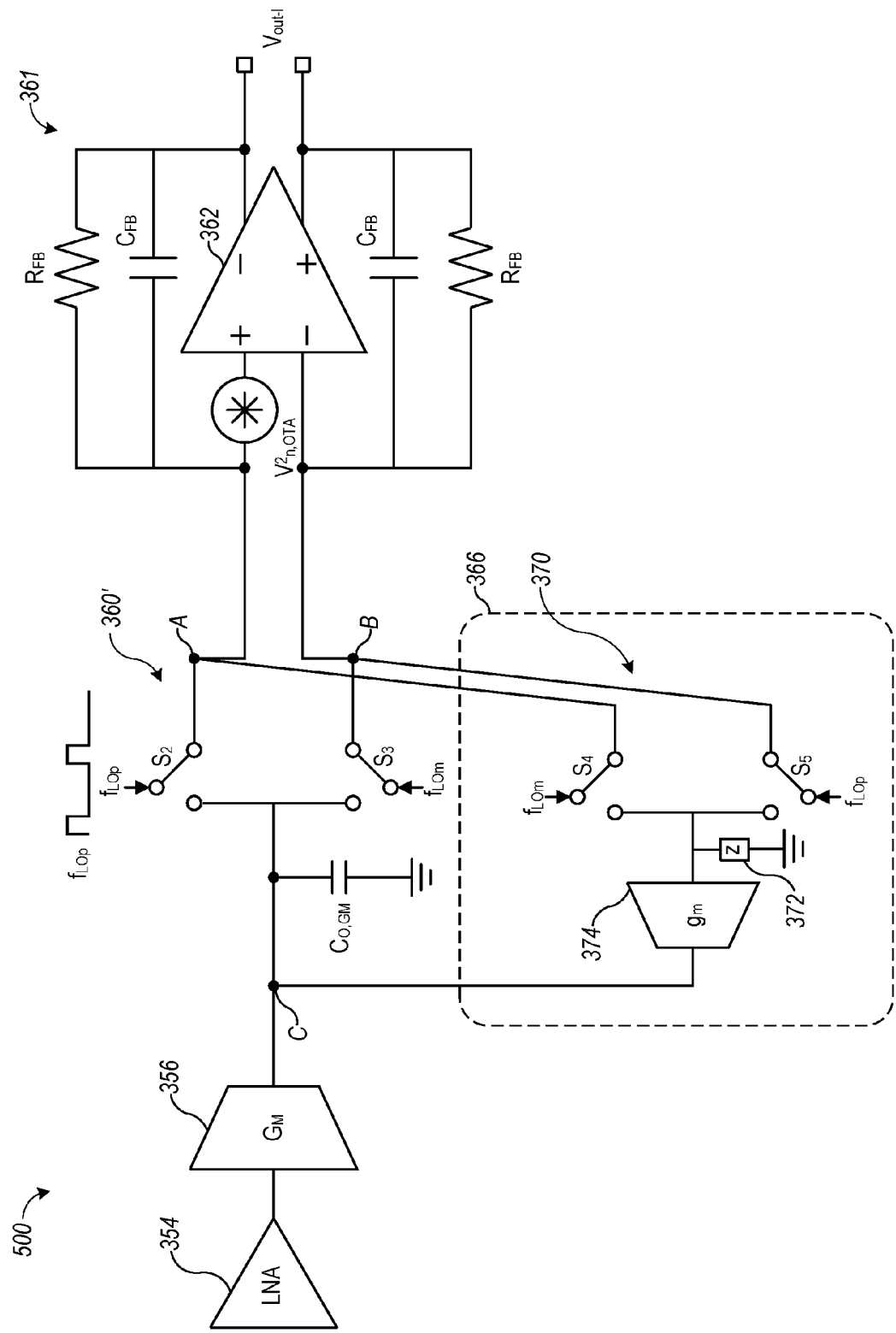
FIG. 7A depicts a device including a mixer, a baseband filter, and an auxiliary path including a mixer, according to aspects of the present disclosure.

FIG. 7A depicts another device 500, in accordance with an aspect of the present disclosure, and illustrates only an in-phase (I) path of the signal. There is also a quadrature (Q) path that is not illustrated. Device 500, which is configured to convey an output voltage $V_{OUT-I}$, includes LNA 354, transconductance amplifier 356, and an energy storage component (e.g., a capacitor) which is modeled herein as capacitor $C_{O,GM}$. Moreover, device 500 includes baseband filter 361 comprising transimpedance amplifier 362, feedback resistors $R_{FB}$, and feedback capacitors $C_{FB}$. Device 500 may also include a component $V^2_{n,OTA}$ for modeling the flicker noise of baseband filter 361.

In addition, device 500 includes mixer 360', which is at least partially represented via switches S2 and S3. Further, device 500 includes an auxiliary path 366 including an auxiliary mixer (e.g., mixer 370), which is at least partially represented via switches S4 and S5, impedance component 372, and transconductance amplifier 374. In some aspects, impedance component 372 can be an input impedance of transconductance amplifier 374, a shunt component such as a resistor, a separate impedance that is included to improve performance of device 500 such as a resistor and a capacitor, or a series conductor and a shunt resistor. As illustrated, switch S4 is coupled to node A, which is further coupled to switch S2, and switch S5 is coupled to node B, which is further coupled to switch S3. An output of transconductance amplifier 374 is coupled via a feedback path to node C, which is also coupled to an output of transconductance amplifier 356. In some aspects, transconductance amplifier 374 can be split into two transconductance amplifiers (not shown), each resulting transconductance amplifier corresponding to a switch (S4 or S5), resulting in two feedback paths.

During a contemplated operation of device 500, switches S2 and S5 are configured to receive local oscillator signal $f_{LOp}$ for a frequency (e.g., a phase) of the duty cycle (by way of non-limiting example, 25% or 50%) to couple one input of transimpedance amplifier 362 to capacitor $C_{O,GM}$ via node A and another input of transimpedance amplifier 362 to node C via auxiliary path 366. More specifically, for example, in this phase of the cycle, the non-inverting input of transimpedance amplifier 362 is coupled to capacitor $C_{O,GM}$ via node A and the inverting input of transimpedance amplifier 362 is coupled to node C via auxiliary path 366. Further, in this phase of the cycle, switches S3 and S4 may be open.

For other frequencies (e.g., another phase) of the duty cycle, switches S3 and S4 are controlled by a local oscillator signal $f_{LOm}$ to couple one input of transimpedance amplifier 362 to capacitor $C_{O,GM}$ via node B and another input of transimpedance amplifier 362 to node C via auxiliary path 366. More specifically, for example, in this phase of the duty cycle, the inverting input of transimpedance amplifier 362 is coupled to the parasitic capacitance, as modeled by capacitor $C_{O,GM}$ via node B and the non-inverting input of transimpedance amplifier 362 is coupled to node C via auxiliary path 366. In this phase of the duty cycle, switches S2 and S5 may be open.

Figure 7B:
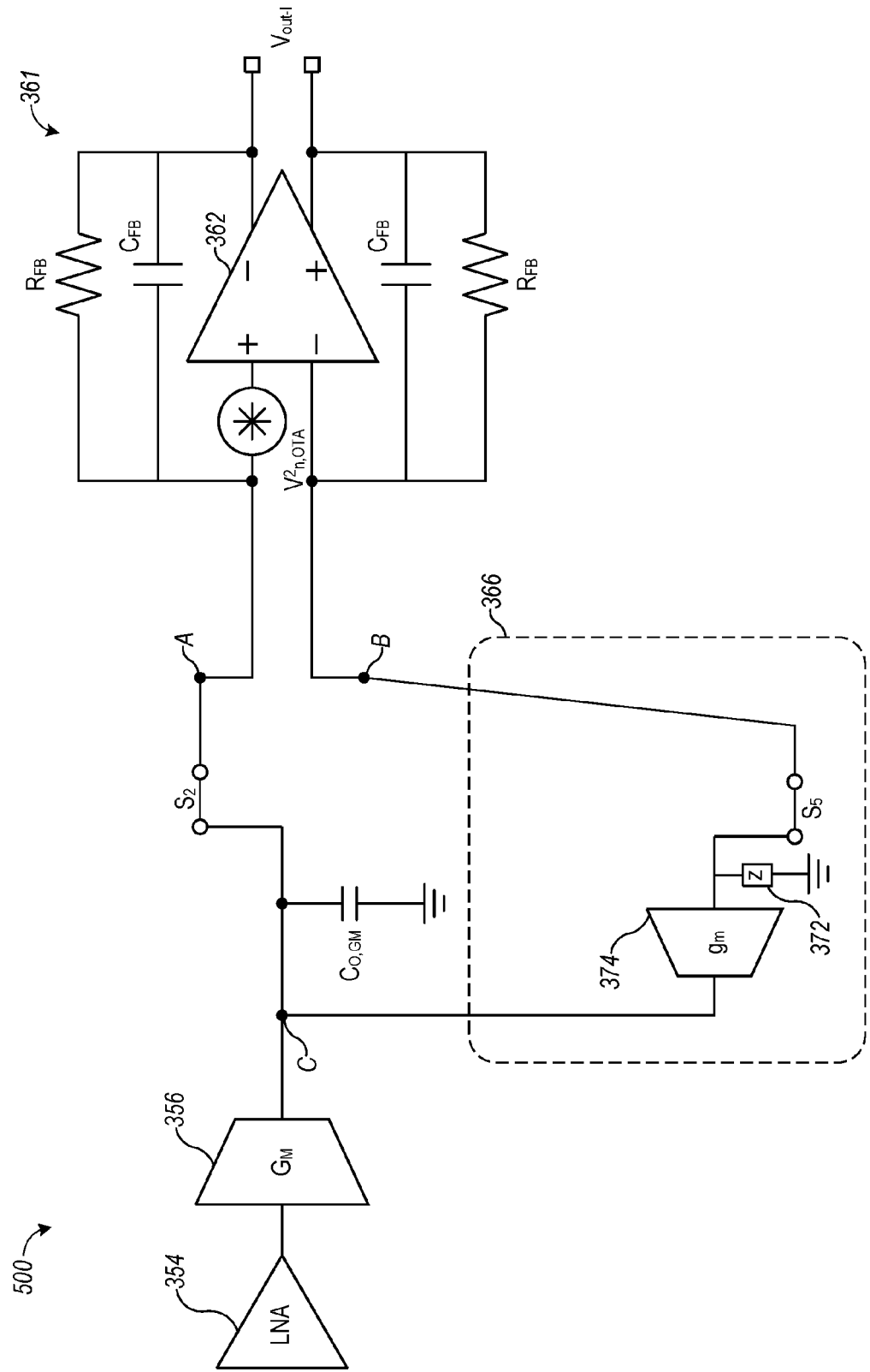
FIG. 7B depicts the device of FIG. 7A during one operational phase, in accordance with aspects of the present disclosure.
Figure 7C:
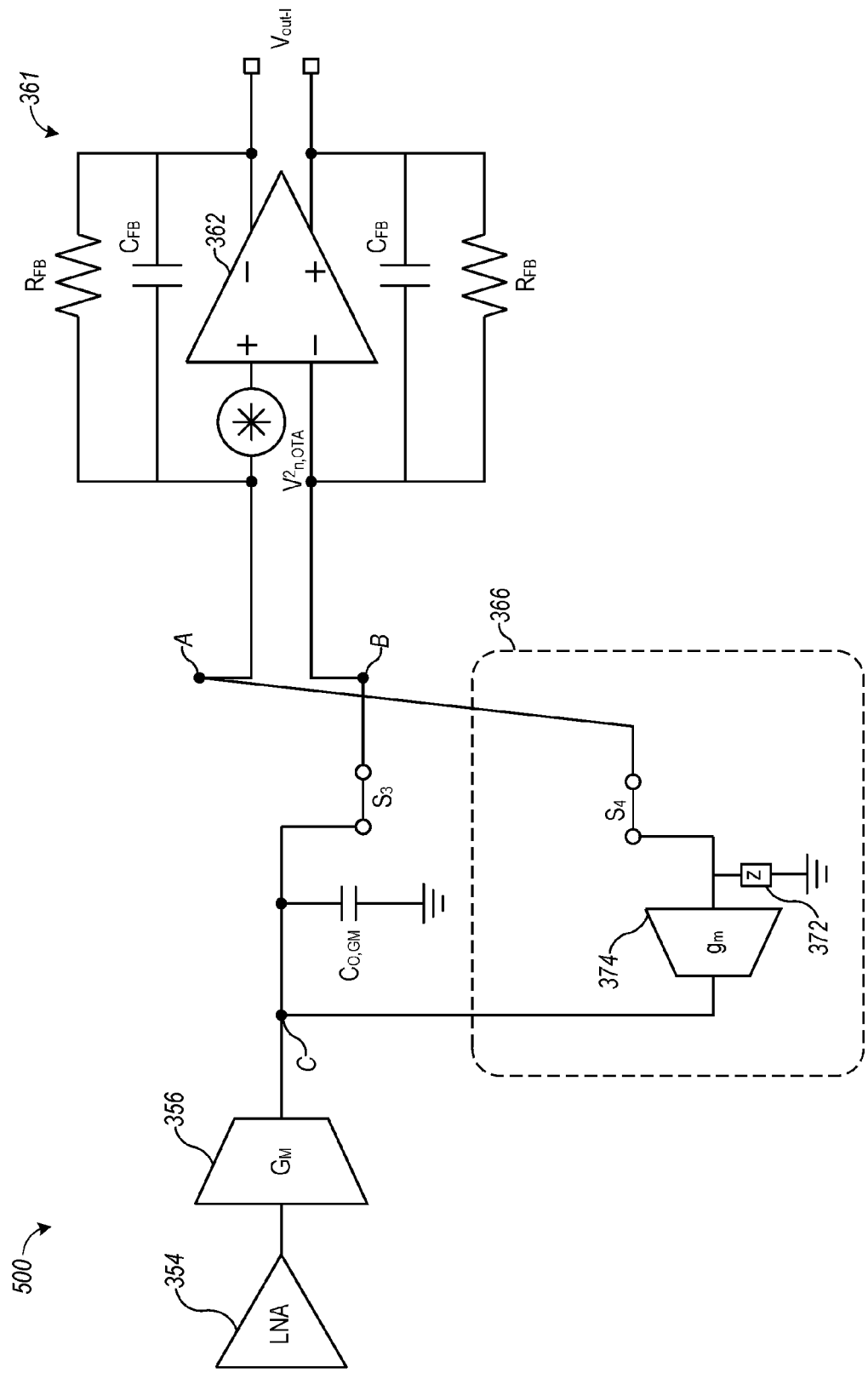
FIG. 7C depicts the device of FIG. 7A during another operational phase, in accordance with aspects of the present disclosure.

FIG. 7B depicts device 500 during one phase of operation and FIG. 7C depicts device 500 during another, different phase of operation. As illustrated in FIG. 7B, during one operational phase, switches S3 and S4 (see FIG. 7A) are open, switches S2 and S5 are closed and, thus, one input (e.g., a non-inverting input) of amplifier 362 is coupled to the parasitic capacitance, as modeled by capacitor $C_{O,GM}$ via switch S2. Another input (e.g., inverting input) of amplifier 362 is coupled to node C via switch S5 of auxiliary path 366.

Further, as illustrated in FIG. 7C, during another operational phase, switches S2 and S5 (see FIG. 7A) are open, switches S3 and S4 are closed and, thus, one input (e.g., an inverting input) of amplifier 362 is coupled to capacitor $C_{O,GM}$ via switch S3. Another input (e.g., non-inverting input) of amplifier 362 is coupled to node C via switch S4 of auxiliary path 366.

It is noted that since transconductance amplifier 374 may be very small, it may not add substantial noise to a receiver. Further, noise from switches of mixer 370 (see FIG. 7A) may also be very small because mixer 370 may be coupled to a high impedance node, such as transconductance amplifier 374.

By providing an auxiliary path (e.g., auxiliary path 366) for the flicker noise current to an input of mixer 360' (see FIG. 7A), the two currents at the input of mixer 360' may, at least partially, cancel out, and much smaller current will flow back to an output of transimpedance amplifier 362. Therefore, flicker noise at the output may be suppressed (e.g., via removing the loading from the mixer). The auxiliary mixer (e.g., mixer 370) provides another path for the flicker noise current, which is out of phase with the flicker noise current flowing through the main mixer (e.g., mixer 360'). During one phase, the flicker noise current is stored as part of the parasitic capacitance, as modeled by capacitor $C_{O,GM}$, and during the next phase, it is discharged by mixer 370. Basically, the two flicker noise currents, from mixer 360' and mixer 370, are cancelled out at the input of mixer 360'. This can be also explained in terms of impedance. The gain of the flicker noise to the output is inversely proportional to the value $R_{MIX}$ (see FIG. 5), which models the loading from mixer 360' to transimpedance amplifier 362. By adding mixer 370, total $R_{MIX}$ may become much larger due to the flicker noise cancellation. Therefore, the flicker noise gain to the output is significantly suppressed by the addition of mixer 370. It is noted that mixer 370, in some particular aspects, may be very small (e.g., ¼ or ⅕ the size of mixer 360'), and transconductance may comprise, by way of non-limiting example, only 3-5 millisiemens.

Figure 8A:
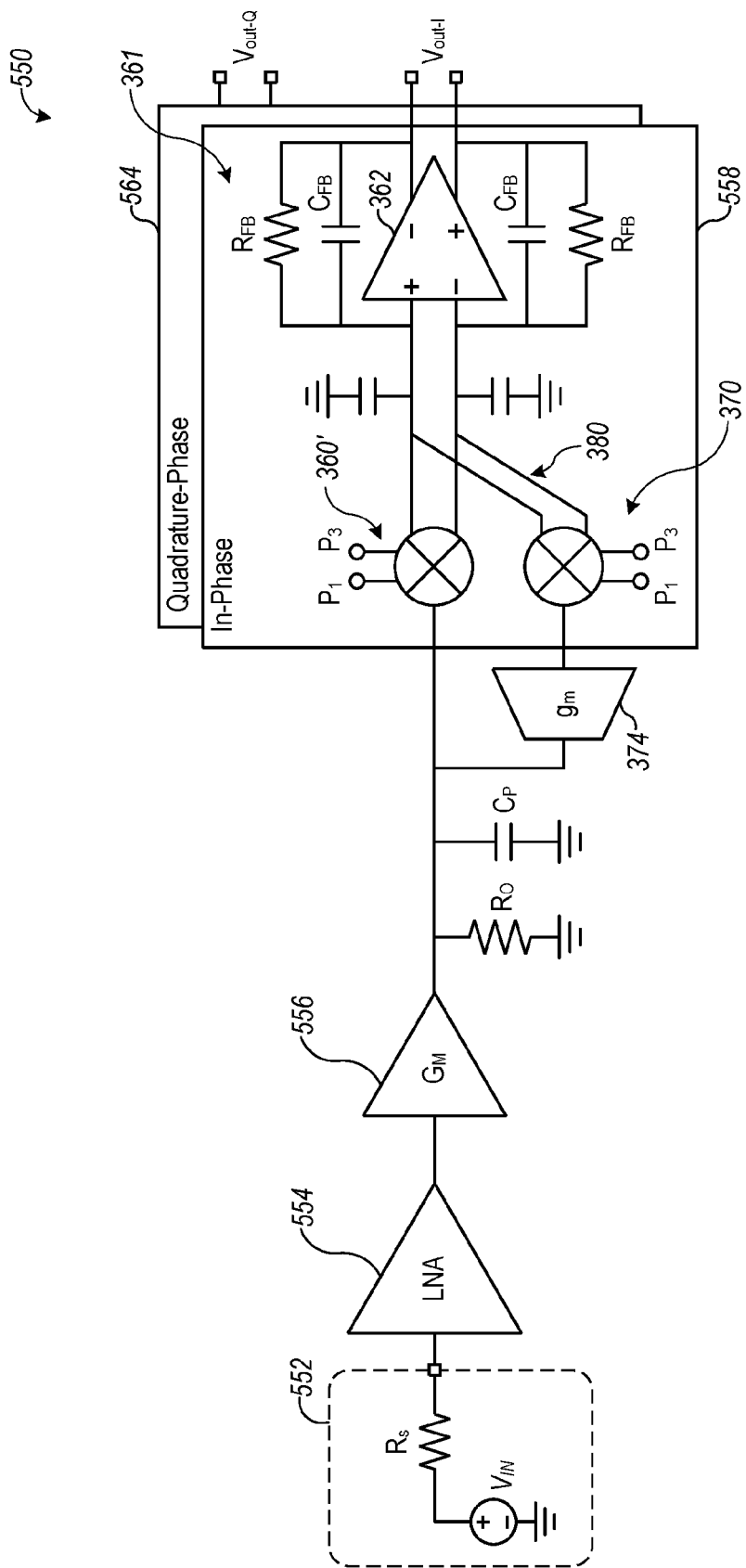
FIG. 8A is another illustration of a device including a mixer, a baseband filter, and an auxiliary path including a mixer, according to aspects of the present disclosure.

FIG. 8A illustrates a device 550, according to an aspect of the present disclosure. Device 550 includes an antenna 552, modeled and illustrated herein by a voltage source $V_{IN}$ and a resistor $R_S$. Device 550 further includes an LNA 554, a transconductance amplifier 556, a resistor $R_O$, and a capacitor Cp. Device 550 further includes an in-phase unit 558 including mixer 360', and baseband filter 361, which comprises transimpedance amplifier 362, resistors R and capacitors $C_{FB}$. In addition, device 550 includes an including mixer 370 and transconductance amplifier 374, along auxiliary path 380. It is noted that device 550 may further include a quadrature-phase unit 564, details of which are not illustrated in FIG. 8A.

Figure 8B:
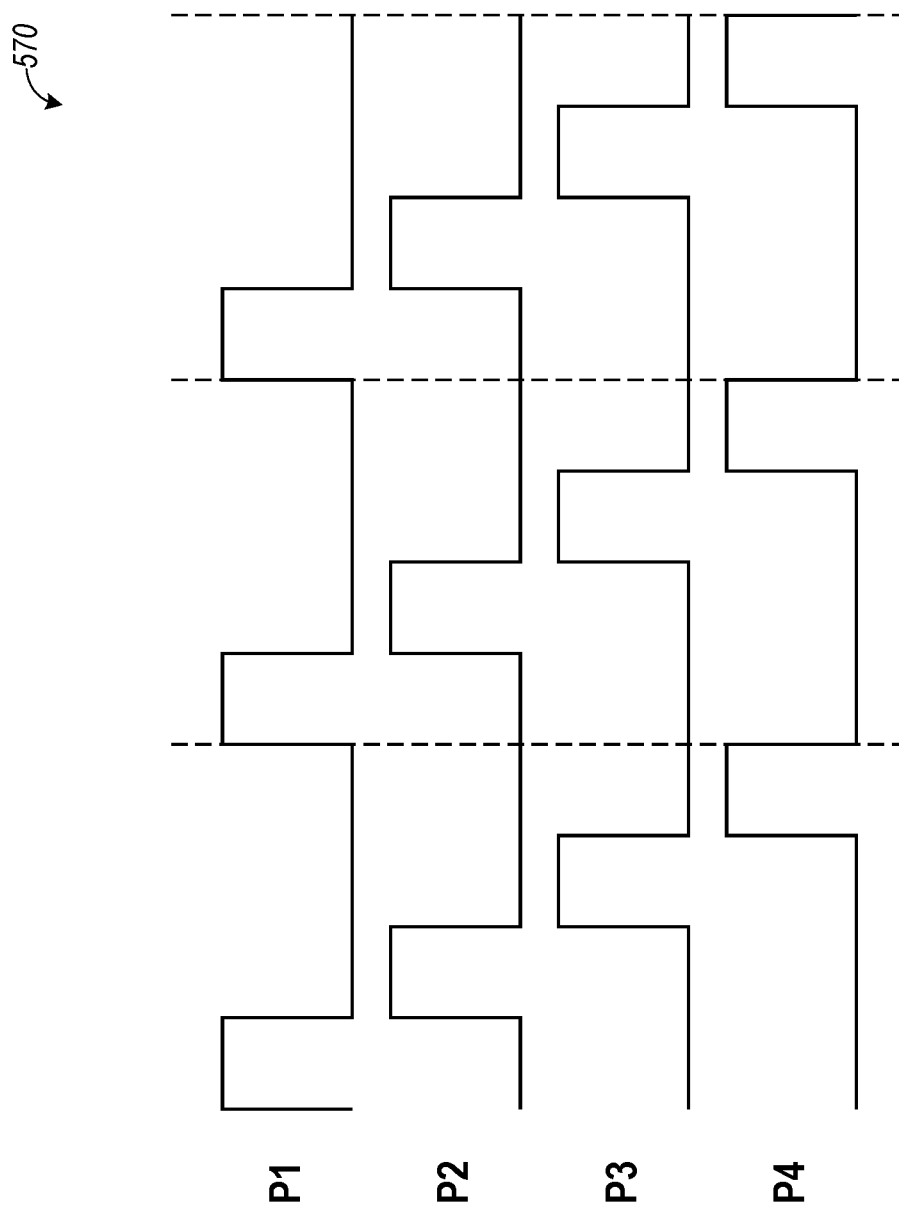
FIG. 8B is a timing diagram depicting contemplated states of control signals for controlling states of the mixers of the device of FIG. 8A, in accordance with aspects of the present disclosure.

FIG. 8B is a timing diagram 570 depicting example states of local oscillator (LO) signals $P_1$-$P_4$, which may be conveyed to device 550 of FIG. 8A. It is noted that LO signals P1 and P3 are conveyed to mixer 360' and mixer 370 within in-phase unit 558, and LO signals P2 and P4 are conveyed to mixers (not shown) of quadrature-phase unit 564. In one non-limiting example, as illustrated in FIG. 8B, signals P1 and P3 are 180 degrees out of phase and each signal P1 and P3 may be high ("on") for 25% of a duty cycle. Continuing with this example, signals P2 and P4 are 180 degrees out of phase and each signal P2 and P4 may be high ("on") for 25% of a duty cycle.

Figure 9:
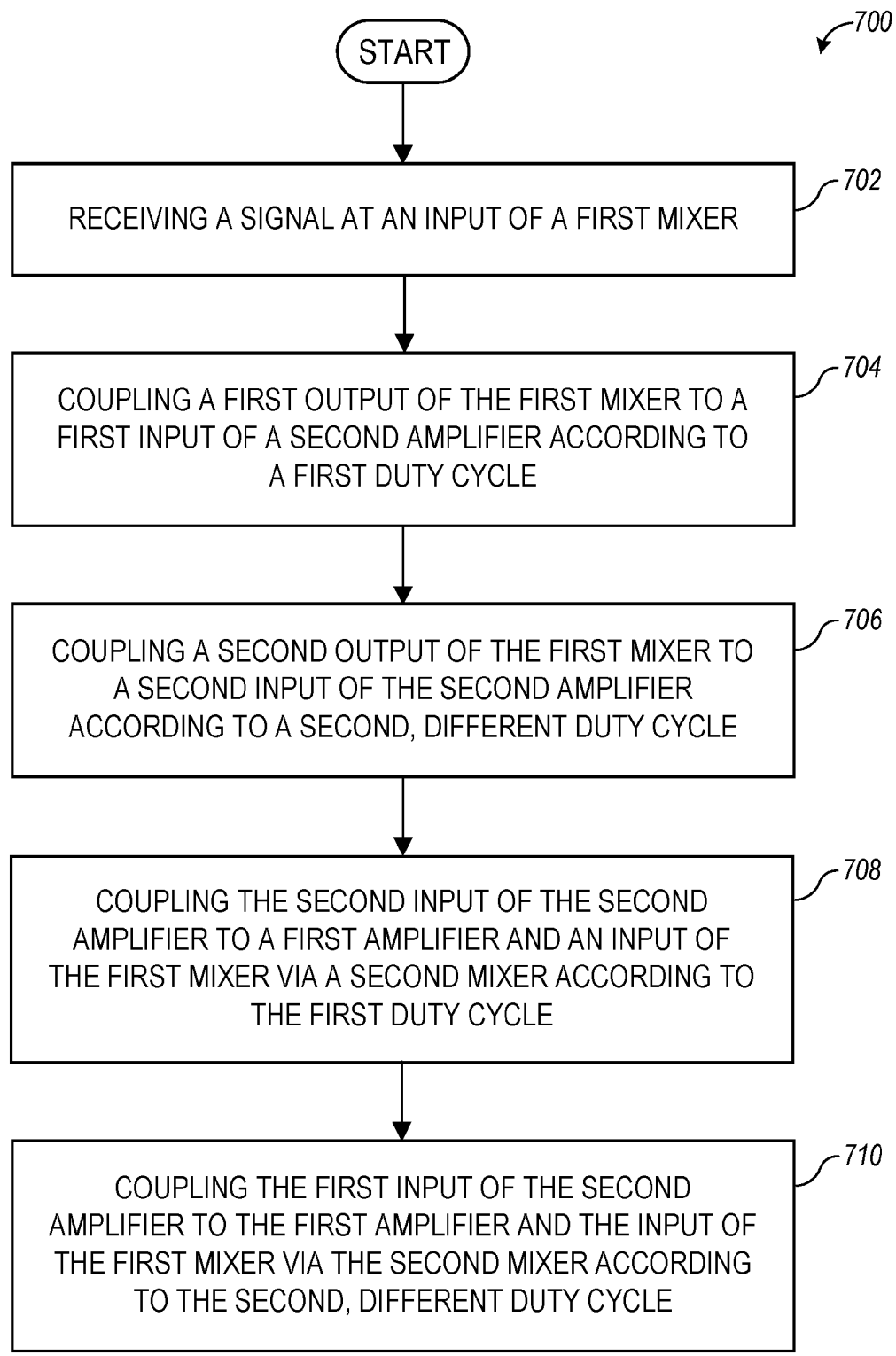
FIG. 9 is a flowchart depicting a method, in accordance with aspects of the present disclosure.

FIG. 9 is a flowchart illustrating a method 700, in accordance with one or more exemplary aspects of the present disclosure. Method 700 may include receiving a signal at an input of a first mixer (depicted by numeral 702). For example, the signal may comprise a radio frequency (RF) signal. Method 700 may also include coupling a first output of the first mixer to a first input of a second amplifier according to a first duty cycle (depicted by numeral 704). Further, method 700 may include coupling a second output of the first mixer to a second input of the second amplifier according to a second, different duty cycle (depicted by numeral 706). Moreover, method 700 may include coupling the second input of the second amplifier to a first amplifier and an input of the first mixer via a second mixer according to the first duty cycle (depicted by numeral 708). In addition, method 700 may include coupling the first input of the second amplifier to the first amplifier and the input of the first mixer via the second mixer according to the second, different duty cycle (depicted by numeral 710).

Figure 10:
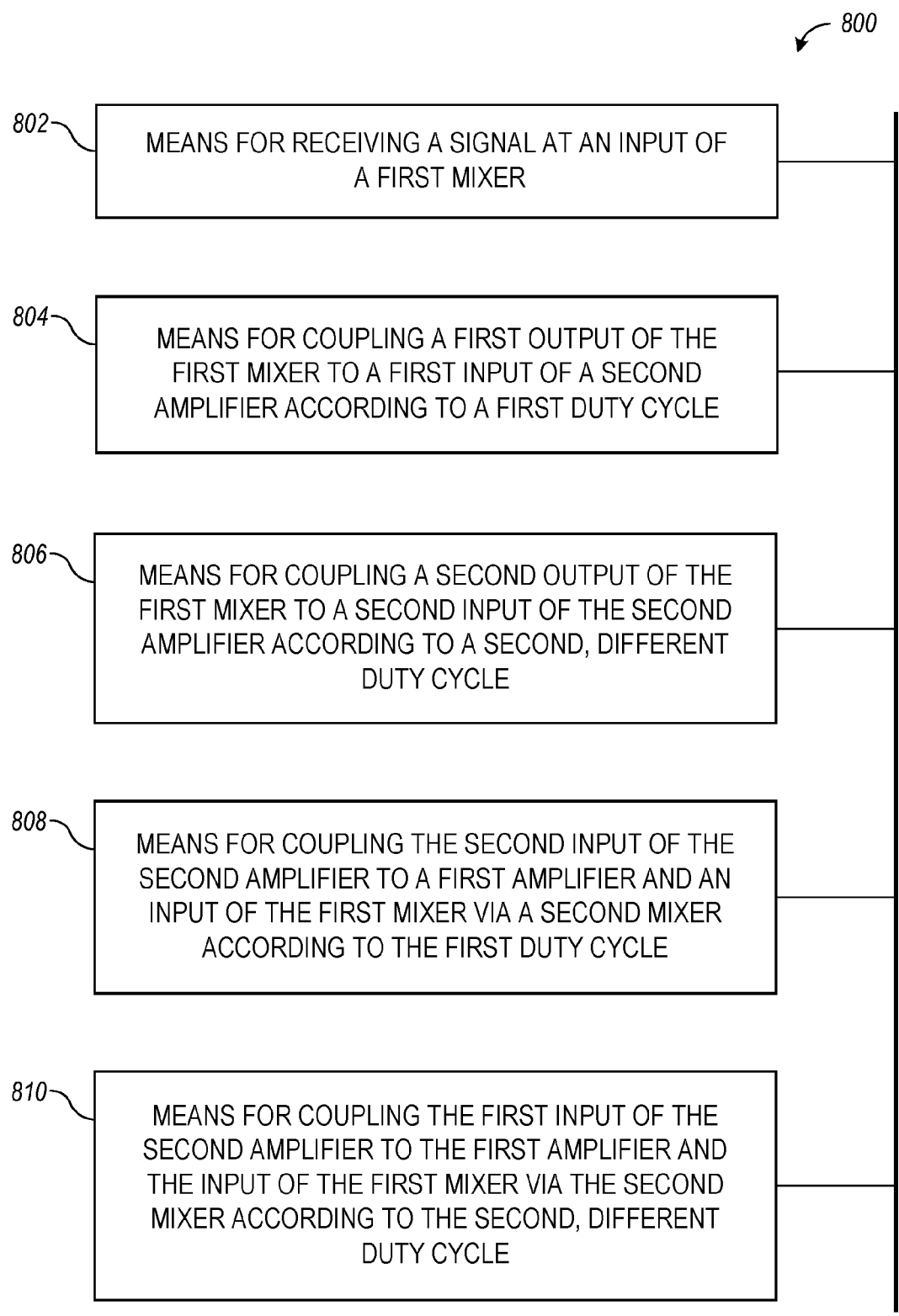
FIG. 10 shows an exemplary receiver device, in accordance with aspects of the present disclosure.

FIG. 10 shows an exemplary receiver device 800, in accordance with aspects of the present disclosure. For example, device 800 may comprise device 500 (see FIG. 7A), device 550 (see FIG. 8A), or any combination thereof. In an aspect, device 800 is implemented by one or more modules configured to provide the functions as described herein. For example, in an aspect, each module comprises hardware and/or hardware executing software.

Device 800 comprises a first module comprising means (802) for receiving a signal at an input of a first mixer. For example, the signal may comprise a radio frequency (RF) signal. For example, devices 500 and 550 (see e.g., FIGS. 7A and 8A) may be configured to receive a signal (e.g., receive a signal via an antenna), and the signal may be received by mixer 360'.

Device 800 also comprises a second module comprising means (804) for coupling a first output of the first mixer to a first input of a second amplifier according to a first duty cycle. For example, mixer 360' (see e.g., FIG. 7A) may be configured to couple the first output of mixer 360' to a first input of amplifier 362 according to a first duty cycle.

Device 800 also comprises a third module comprising means (806) for coupling a second output of the first mixer to a second input of the second amplifier according to a second, different duty cycle. For example, mixer 360' (see e.g., FIG. 7A) may be configured to couple the second output of mixer 360' to a second input of amplifier 362 according to the second, different duty cycle.

Further, device 800 may comprise a fourth module comprising means (808) for coupling the second input of the second amplifier to a first amplifier (e.g., a transconductance amplifier) and an input of the first mixer via a second mixer according to the first duty cycle. For example, mixer 370

(see e.g., FIG. 7A) may be configured to couple the second input of the second amplifier 362 to amplifier 374 and the input of mixer 360' according to the first duty cycle.

In addition, device 800 may comprise a fifth module comprising means (810) for coupling the first input of the second amplifier to the first amplifier and the input of the first mixer via the second mixer according to the second, different duty cycle. For example, mixer 370 (see e.g., FIG. 7A) may be configured to couple the first input of amplifier 362 to amplifier 374 and the input of mixer 360' according to the second, different duty cycle.

Exemplary aspects, as disclosed herein, may decrease flicker noise by, for example, 10 dB with very small penalty in power and area. Further, integrated noise figure (NF) for different offset may also be improved. In addition, the loop gain of a transimpedance amplifier may be improved by, for example, more than 20 dB. Because loop gain may be improved, as a result, baseband linearity may also be improved.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects.

The various illustrative logical blocks, modules, and circuits described in connection with the exemplary aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is noted that combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

Various model elements have been described in relation to various aspects herein. These model elements are used primarily for illustrative purposes only, and are not necessarily part of the aspects as described herein. Specific ranges or limits as described herein are provided as examples only, and are non-limiting The previous description of the disclosed exemplary aspects is provided to enable any person skilled in the art to make or use the present disclosure. Various modifications to these exemplary aspects will be readily apparent to those skilled in the art, and the generic principles defined herein may be applied to other aspects without departing from the spirit or scope of the disclosure. Thus, the present disclosure is not intended to be limited to the exemplary aspects shown herein but is to be accorded the widest scope consistent with the principles and novel features disclosed herein.

What is claimed is:

1. A device, comprising:
   a receive path including a first amplifier, and a first mixer coupled to an output of the first amplifier and to an input of a second amplifier; and
   an auxiliary path including a second mixer coupled between an output of the first mixer and an input of the first mixer, the auxiliary path further comprising an impedance component coupled between an input of a third amplifier, an output of the second mixer, and a ground.

2. The device of claim 1, in which the second amplifier comprises a transimpedance amplifier.

3. The device of claim 1, in which the first amplifier comprises a first transconductance amplifier.

4. The device of claim 3, in which the third amplifier comprises a second transconductance amplifier.

5. The device of claim 1, further comprising:
   a low-noise amplifier (LNA); and the first amplifier coupled between the LNA and the first mixer.

6. The device of claim 1, in which the first mixer is configured to receive a first local oscillator (LO) signal having a first duty cycle to couple a first output of the first mixer to a first input of the second amplifier according to the first duty cycle and to receive a second LO signal having a second, different duty cycle to couple a second output of the first mixer to a second input of the second amplifier according to the second, different duty cycle.

7. The device of claim 6, in which the second mixer is configured to receive the first LO signal to couple the second input of the second amplifier to the input of the first mixer according to the first duty cycle and to receive the second LO signal to couple the first input of the second amplifier to the input of the first mixer according to the second, different duty cycle.

8. The device of claim 7, in which the first LO signal and the second LO signal are 180 degrees out of phase.

9. The device of claim 1, further comprising a baseband filter including the second amplifier.

10. The device of claim 1, in which the second amplifier is configured to output one of an in-phase signal or a quadrature-phase signal.

11. A method, comprising:
receiving a signal at an input of a first mixer;
coupling a first output of the first mixer to a first input of a second amplifier according to a first duty cycle;
coupling a second output of the first mixer to a second input of the second amplifier according to a second, different duty cycle;
coupling the second input of the second amplifier to a first amplifier and an input of the first mixer via a second mixer according to the first duty cycle;
coupling the first input of the second amplifier to the first amplifier and the input of the first mixer via the second mixer according to the second, different duty cycle; and
coupling an impedance component between an input of a third amplifier, an output of the second mixer, and a ground.

12. The method of claim 11, further comprising:
conveying a first local oscillator (LO) signal to the first mixer according to the first duty cycle; and
conveying a second LO signal to the first mixer according to the second, different duty cycle.

13. The method of claim 12, further comprising:
conveying the first LO signal to the second mixer according to the first duty cycle; and
conveying the second LO signal to the second mixer according to the second, different duty cycle.

14. The method of claim 11, in which the first amplifier comprises a transconductance amplifier.

15. The method of claim 14, in which coupling the second input of the second amplifier to a transconductance amplifier and an input of the first mixer via the second mixer according to the first duty cycle comprises coupling the second input of the second amplifier to the transconductance amplifier and the input of the first mixer via an auxiliary path including the second mixer.

16. The method of claim 14, in which coupling the first input of the second amplifier to the transconductance amplifier and the input of the first mixer via the second mixer according to the second, different duty cycle comprises coupling the first input of the second amplifier to the transconductance amplifier and the input of the first mixer via an auxiliary path including the second mixer.

17. The method of claim 11, in which receiving the signal at the input of the first mixer comprises receiving the signal comprising a first portion received from an antenna and a second portion received from an auxiliary path including the second mixer.

18. A device, comprising:
means for receiving a signal at an input of a first mixer;
means for coupling a first output of the first mixer to a first input of a second amplifier according to a first duty cycle;
means for coupling a second output of the first mixer to a second input of the second amplifier according to a second, different duty cycle;
means for coupling the second input of the second amplifier to a first amplifier and an input of the first mixer via a second mixer according to the first duty cycle;
means for coupling the first input of the second amplifier to the first amplifier and the input of the first mixer via the second mixer according to the second, different duty cycle; and
means for coupling an impedance component between an input of a third amplifier, an output of the second mixer, and a ground.

19. The device of claim 18, further comprising:
means for conveying a first local oscillator (LO) signal to the first mixer according to the first duty cycle to couple the first output of the first mixer to the first input of the second amplifier; and
means for conveying a second LO signal to the first mixer according to the second, different duty cycle to couple the second output of the first mixer to the second input of the second amplifier.

20. The device of claim 19, further comprising:
means for conveying the first LO signal to the second mixer according to the first duty cycle to couple the second input of the second amplifier to the first amplifier and the input of the first mixer via the second mixer according to the first duty cycle; and
means for conveying the second LO signal to the second mixer according to the second, different duty cycle to couple the first input of the second amplifier to the first amplifier and the input of the first mixer.

21. The device of claim 20, in which the first amplifier comprises a transconductance amplifier.

* * * * *